United States Patent
Naruta

(10) Patent No.: US 8,423,342 B2
(45) Date of Patent: Apr. 16, 2013

(54) SIMULATION PARAMETER EXTRACTING METHOD OF MOS TRANSISTOR

(75) Inventor: Yasuhisa Naruta, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 352 days.

(21) Appl. No.: 12/969,256

(22) Filed: Dec. 15, 2010

(65) Prior Publication Data

US 2011/0144968 A1    Jun. 16, 2011

(30) Foreign Application Priority Data

Dec. 16, 2009 (JP) ................. 2009-284850

(51) Int. Cl.
*G06F 17/50* (2006.01)

(52) U.S. Cl.
USPC ........... 703/14; 257/386; 257/296; 257/57; 703/13; 703/15; 703/16

(58) Field of Classification Search .......... None
See application file for complete search history.

(56) References Cited

U.S. PATENT DOCUMENTS 6,472,233 B1 * 10/2002 Ahmed et al. ............. 438/14

FOREIGN PATENT DOCUMENTS

JP    2008-225557 A    9/2008

OTHER PUBLICATIONS

Nihar Mohapatra, Madhav Desai, Siva Narendra, Ramgopal Rao Modeling of Parasitic Capacitances in Deep Submicrometer Conventional and High-K Dielectric MOS Transistors IEEE Transactions on Electron Devices, vol. 50, No. 4, Apr. 2003, pp. 959-966.*

* cited by examiner

*Primary Examiner* — Saif Alhija
*Assistant Examiner* — Cuong Luu
(74) *Attorney, Agent, or Firm* — Sughrue Mion, PLLC

(57) ABSTRACT

A simulation parameter extracting method of a MOS transistor according to an exemplary aspect of the present invention includes evaluating a measured value that includes a true gate-overlap capacitance by measuring a capacitance between the gate and the drain in each of a plurality of layout patterns at a predetermined bias voltage, only the number of contact plugs being different for each layout pattern, evaluating a gate-overlap capacitance calculation value of each layout pattern by subtracting a contact parasitic capacitance between the contact plug and the gate from the measured value, the contact parasitic capacitance being obtained by a simulation with varying a model parameter for evaluating a parasitic capacitance between the contact plug and the gate, and extracting the gate-overlap capacitance calculation value as the true gate-overlap capacitance at the model parameter when the gate-overlap capacitance calculation value is about constant regardless of the number of the contact plugs.

6 Claims, 8 Drawing Sheets

SIMULATION PARAMETER EXTRACTING METHOD OF MOS TRANSISTOR

INCORPORATION BY REFERENCE

This application is based upon and claims the benefit of priority from Japanese patent application No. 2009-284850, filed on Dec. 16, 2009, the disclosure of which is incorporated herein in its entirety by reference.

BACKGROUND

1. Field of the Invention

The present invention relates to a simulation parameter extracting method of a MOS transistor.

2. Description of Related Art

In a simulation of a MOS transistor, a gate-overlap capacitance is one of physically important parameters. The gate-overlap capacitance is a capacitance of a part where the gate overlaps with the source or the drain in the MOS transistor. A gate-overlap capacitance value critically affects operation speed of a semiconductor device using a practical MOS transistor. Therefore, an accurate evaluation of the gate-overlap capacitance value has been desired.

To evaluate the gate-overlap capacitance, a TEG (Test Element Group) pattern is used. The TEG pattern includes the MOS transistor including the gate, the source and the drain. Further, contact plugs are formed on the source and the drain in the TEG pattern. The contact plugs are electrically connected to each of the source and the drain. A capacitance is measured by connecting a tester to the gate and the contact plug. The measured value obtained by the above-mentioned measurement includes a contact parasitic capacitance between the contact plug and the gate as well as the gate-overlap capacitance to be evaluated.

A method described below is known as a method to extract the gate-overlap capacitance from the measured value. First, the contact parasitic capacitance is evaluated by a simulation such as a TCAD (Technology Computer Aided Design) in the method. Next, the gate-overlap capacitance is calculated by subtracting a contact parasitic capacitance value evaluated by a simulation from the measured value including the contact parasitic capacitance. Even if it is impossible to neglect the effect of the contact parasitic capacitance when a distance between the contact plug and the gate is narrow, the gate-overlap capacitance can be calculated by the method.

A shape of the practical contact plug may be different for each wafer. To accurately evaluate the contact parasitic capacitance, it is necessary to observe a cross-sectional shape of a practically measured MOS transistor and input the cross-sectional shape thereof to a simulator. Therefore, it is necessary to expose the cross section of the measured TEG pattern to observe the cross-sectional shape of the practical MOS transistor. After exposing the cross section of the TEG pattern, it is impossible to measure the TEG pattern. Further, a process to observe the cross-sectional shape of the practical MOS transistor increases.

Furthermore, it is difficult to accurately input the cross-sectional shape of the MOS transistor to the simulator. Practically, only the shape change such as shape-expansion or shape-shrinkage is simply evaluated based on the shape of the contact plug obtained from the result of the cross-sectional observation. Then, the shape change is converted to a simple square pillar, and the simple square pillar is input to the simulator.

Therefore, the cross-sectional shape of the practical MOS transistor is different from the shape input to the simulator. Thus, it is considered that an error between the evaluated contact parasitic capacitance and the practical contact parasitic capacitance is caused. Even if the cross-sectional shape of the MOS transistor is accurately input, it is impossible to judge whether the contact parasitic capacitance is accurately evaluated or not.

Further, it is reported that the gate-overlap length is changed when a distance (gate space) between adjacent gates, or a distance between the gate and the contact plug, is changed. Especially, when the gate space is narrow, or the distance between the gate and the contact plug is narrow, the variation of the gate-overlap length stands out compared with the case of the gate space being wide. Therefore, it is desired that the method to extract the accurate overlap parasitic capacitance value when the gate space is narrow is achieved.

Furthermore, Japanese Unexamined Patent Application Publication No. 2008-225557 discloses a method to extract a diffusion layer resistance by a simulation using a diffusion layer resistor model. In Japanese Unexamined Patent Application Publication No. 2008-225557, a confirmation of extracting precision is performed by using a layout pattern in which the number and arrangement of contact plugs is changed.

SUMMARY

However, the present inventor has found a problem that it is difficult to accurately extract the gate-overlap capacitance without the cross-sectional shape observation of the practical MOS transistor by the conventional extracting method of the gate-overlap capacitance.

A first exemplary aspect of the present invention is a simulation parameter extracting method of a MOS transistor that extracts a true gate-overlap capacitance serving as a capacitance of a part in which the gate overlaps the source or the drain, the true gate-overlap capacitance being one of parameters used for a simulation of the MOS transistor, the method including: evaluating a measured values that includes a true gate-overlap capacitance by measuring a capacitance between the gate and the drain in each of a plurality of layout patterns at a predetermined bias voltage, the layout patterns including contact plugs that are arranged on and electrically connected to the source and the drain, the number of the contact plugs being different for each layout pattern, other configurations of the layout patterns than the number of the contact plugs being the same for each layout pattern; evaluating a gate-overlap capacitance calculation value of each of the plurality of the layout patterns by subtracting a contact parasitic capacitance between the contact plug and the gate from the measured value, the contact parasitic capacitance being obtained by a simulation with varying a model parameter for evaluating a parasitic capacitance between the contact plug and the gate; and extracting the gate-overlap capacitance calculation value as the true gate-overlap capacitance at the model parameter when the gate-overlap capacitance calculation value is about constant regardless of the number of the contact plugs.

The true gate-overlap capacitance is constant when a shape of a part where the gate overlaps with the source or the drain is not changed, even if other shapes (the number of the contact plugs, a distance between the gate and the contact plug, or the like) are changed. The physical law described above is used in the simulation parameter extracting method of the MOS transistor in accordance with the first exemplary aspect of the present invention. A dependence on the number of the contact plugs of the gate-overlap capacitance is evaluated by using the layout patterns only the numbers of the contact plugs of which are different for each layout pattern. Further, the parasitic capacitance between the contact plug and the gate can be accurately evaluated by varying only a shape of the contact plugs such as a distance between the contact plug and the gate. Therefore, the true gate-overlap capacitance can be accurately extracted without a cross-sectional observation of the practical MOS transistor even if the effect of the parasitic capacitance between the contact plug and the gate cannot be neglected.

According to the simulation parameter extracting method of the MOS transistor in accordance with an exemplary aspect of the present invention, it is possible to precisely extract a simulation parameter of a MOS transistor.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

[First Exemplary Embodiment]

A simulation parameter extracting method of a MOS transistor according to a first exemplary embodiment of the present invention is described with reference to the drawings. The present exemplary embodiment relates to a method to evaluate a true gate-overlap capacitance, which is one of parameters used for a simulation of a MOS transistor, serving as a capacitance at a part where the gate overlaps with the drain.

Figure 1:
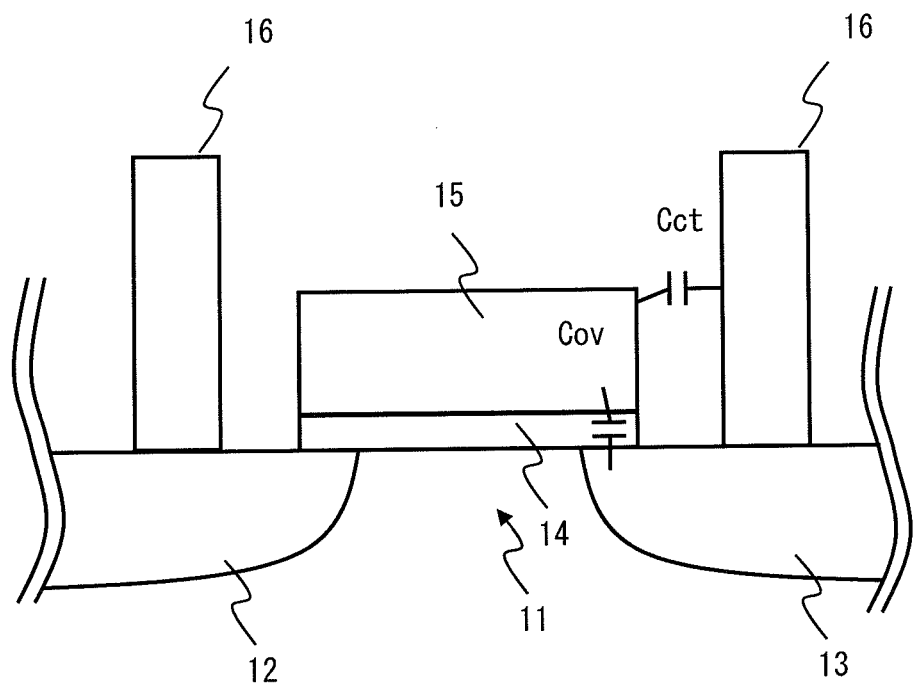
FIG. 1 is a cross-sectional view schematically showing a sectional configuration of a MOS transistor according to a first exemplary embodiment.

FIG. 1 is a cross-sectional view schematically showing a sectional configuration of a MOS transistor. As shown in FIG. 1, the source 12 and the drain 13 are formed at a regular interval in a well 11 of a semiconductor substrate. The gate 15 is formed on the well 11 between the source 12 and the drain 13 with a gate insulating film 14 interposed therebetween.

Contact plugs 16 are each formed on the source 12 and the drain 13. The contact plugs 16 electrically connect the source 12 or the drain 13 to wires (not shown in drawings) formed on the gate 15 with the gate insulating film 14 interposed therebetween. The contact plugs 16 are formed at a regular interval from the gate 15. In the present exemplary embodiment, a true gate-overlap capacitance Cov, serving as a parasitic capacitance at the part where the gate 15 overlaps with the drain 13, is evaluated.

A capacitance is measured with a tester connected to the gate 15 and the contact plug 16, thereby a measured value Cmeas0 being obtained. The measured value Cmeas0 includes a contact parasitic capacitance Cct serving as a parasitic capacitance between the gate 15 and the contact plug 16 as well as the true gate-overlap capacitance Cov. When a distance between the contact plug 16 and the gate 15 is short, the contact parasitic capacitance Cct cannot be neglected.

The true gate-overlap capacitance Cov of the MOS transistor is constant when a shape of the part where the gate overlaps with the source or the drain is not changed, even if the number of the contact plugs 16 is changed. The physical law described above is used in the present exemplary embodiment. Thus, the contact parasitic capacitance Cct is accurately evaluated, and the contact parasitic capacitance Cct is eliminated from the measured value Cmeas0, thereby the accurate true gate-overlap capacitance Cov being evaluated.

Figure 2:
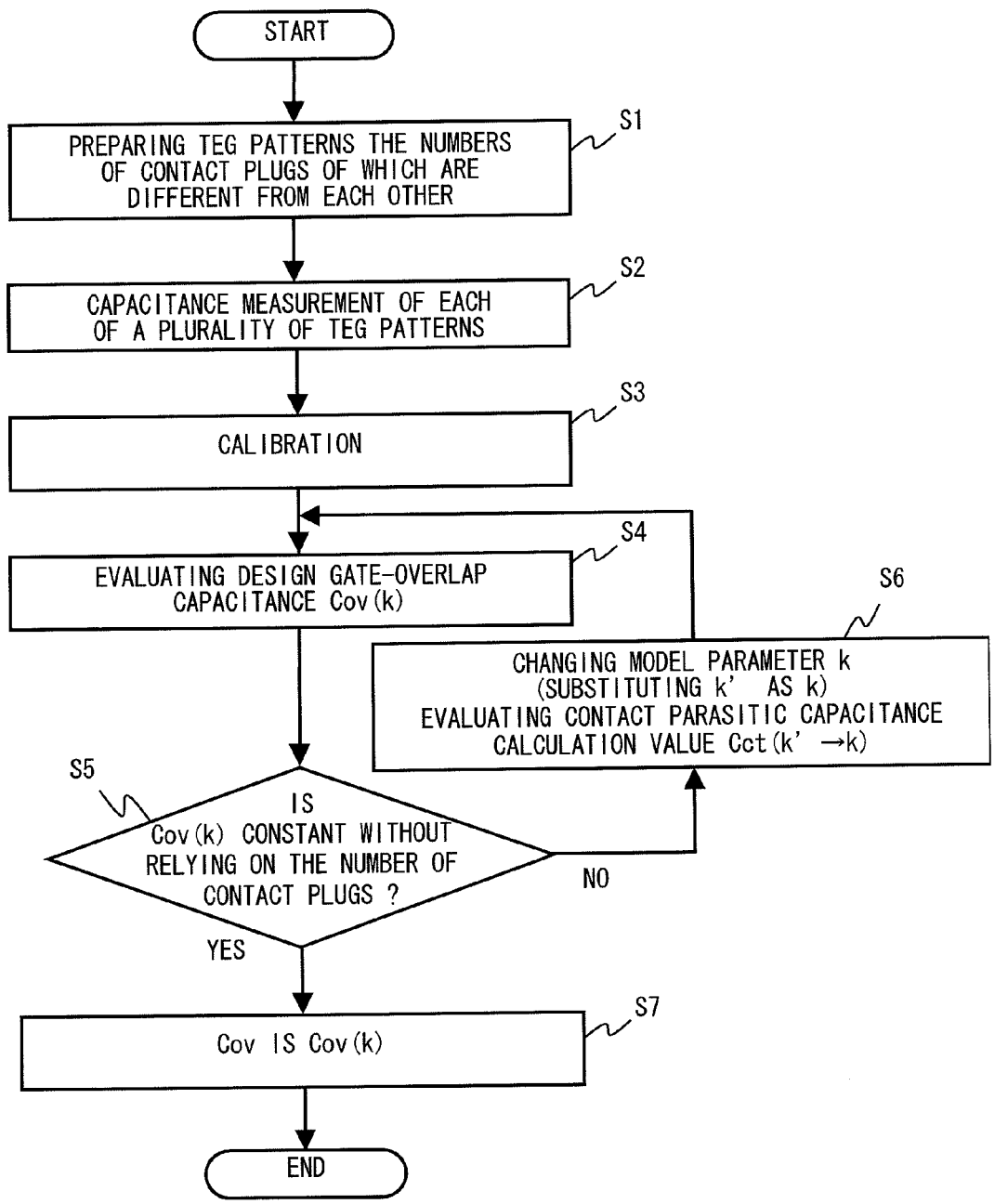
FIG. 2 is a flow chart to explain a simulation parameter extracting method according to a first exemplary embodiment.

Hereinafter, the simulation parameter extracting method according to the present exemplary embodiment is specifically described. FIG. 2 is a flow chart to explain the simulation parameter extracting method according to the present exemplary embodiment. First, as shown in FIG. 2, layout patterns (TEG patterns) the numbers of contact plugs 16 of which are different from each other are prepared (S1).

Figure 3A:
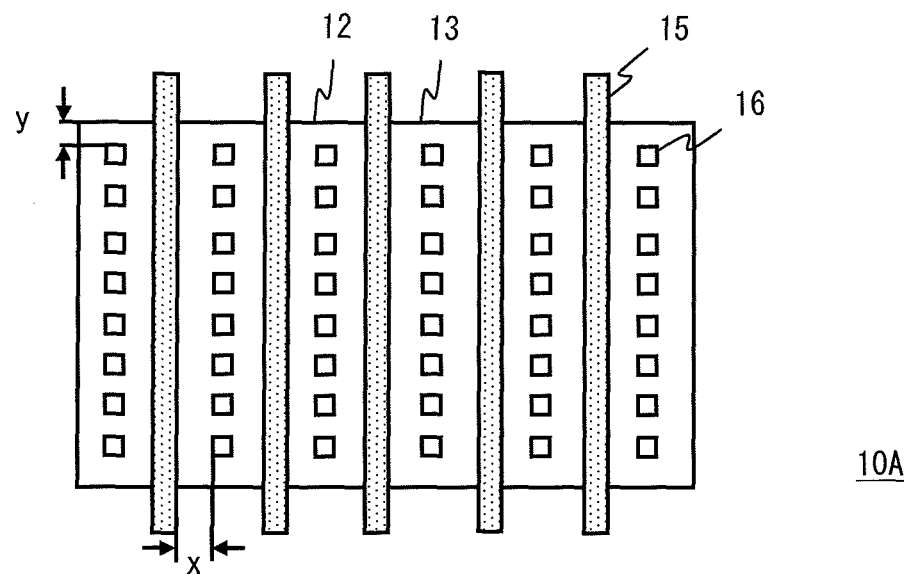
FIG. 3A is a top view showing a configuration of a TEG pattern used in a first exemplary embodiment.
Figure 3B:
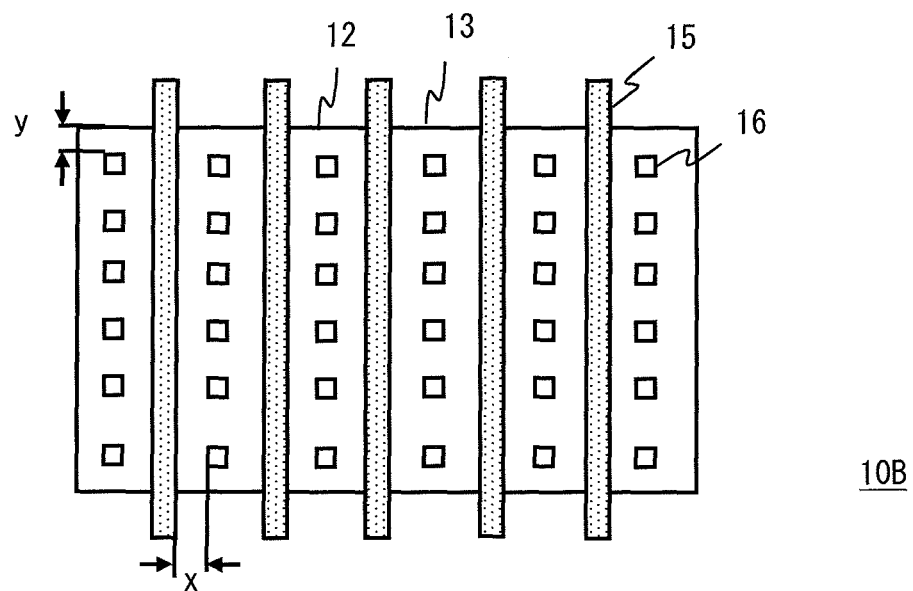
FIG. 3B is a top view showing a configuration of a TEG pattern used in a first exemplary embodiment.
Figure 3C:
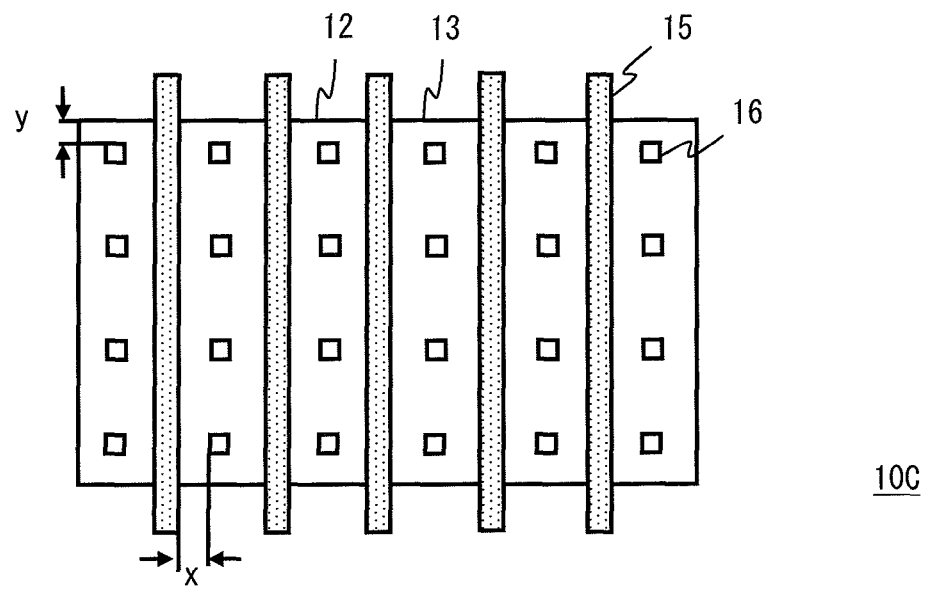
FIG. 3C is a top view showing a configuration of a TEG pattern used in a first exemplary embodiment.

FIGS. 3A to 3C are top views showing configurations of TEG patterns used in the present exemplary embodiment. In the TEG patterns, a plurality of the MOS transistors are connected in series. In this case, an example in which five gates 15 are formed is represented. The gates 15 are arranged in parallel each other at a predetermined distance between gates. The MOS transistors connected in series between the two gates 15 share the source 12 and the drain 13.

In the TEG pattern 10A shown in FIG. 3A, eight contact plugs 16 are formed on each of the source 12 and the drain 13. In the TEG pattern 10B shown in FIG. 3B, six contact plugs 16 are formed on each of the source 12 and the drain 13. In the TEG pattern 10C shown in FIG. 3C, four contact plugs 16 are formed on each of the source 12 and the drain 13.

In the TEG patterns 10A to 10C, only the numbers of the contact plugs 16 are different from each other, and other layout configurations are the same as each other. In sum, a distance x between the contact plug 16 and the gate 15 is constant in the TEG patterns 10A to 10C. Further, contact plugs 16 are approximately arranged in a regular interval in each TEG pattern.

Furthermore, it is desirable that a distance y between the contact plug 16 and an edge of a diffusion region of the source 12 or the drain 13 is constant in the TEG patterns 10A to 10C. This is to suppress a surrounding effect at the edge of the diffusion region of the source 12 or the drain 13.

In FIGS. 3A to 3C, an example in which the distance between the contact plug 16 and the edge of the diffusion region of the source 12 or the drain 13 is constant is described. However, it is not limited to this example. For example, the number of the contact plugs 16 can be reduced from a low side while maintaining the arrangement of the contact plugs 16 shown in FIG. 3A. In sum, the distance between the contact plug 16 and the edge of the diffusion region of the source 12 or the drain 13 may be changed.

In the present exemplary embodiment, three TEG patterns the numbers of the contact plugs 16 of which are different from each other are prepared. However, it is not limited to this example. Two or more TEG patterns the numbers of the contact plugs of which are different from each other may be prepared.

A tester is connected to the gate 15 and the contact plug 16 on the drain 13 in each of the TEG patterns 10A to 10C described above, thereby the capacitances being measured at predetermined bias voltages (Vg and Vd) (S2). As a result, contact plug dependence of the measured capacitance value Cmeas0 is obtained.

For example, the predetermined bias voltages (Vg and Vd) are voltages at which a channel is not formed in the well 11 below the gate 15. This is because a capacitance larger than the true gate-overlap capacitance is generated between the gate 15 and the well 11 when the channel is formed, and therefore the true gate-overlap capacitance cannot be accurately measured.

Generally, the channel turns off when Vg=0 V and Vd=0 V in the MOS transistor. Thus, the predetermined bias voltages can be set at Vg=0 V and Vd=0 V. Note that the channel may not turn off when Vg=0 V and Vd=0 V due to manufacturing variations.

Therefore, Vg and Vd at which the measured capacitance is minimum, or the channel turns off, may be determined by measuring the capacitance while changing Vg and Vd in each of a plurality of the TEG patterns.

Figure 5:
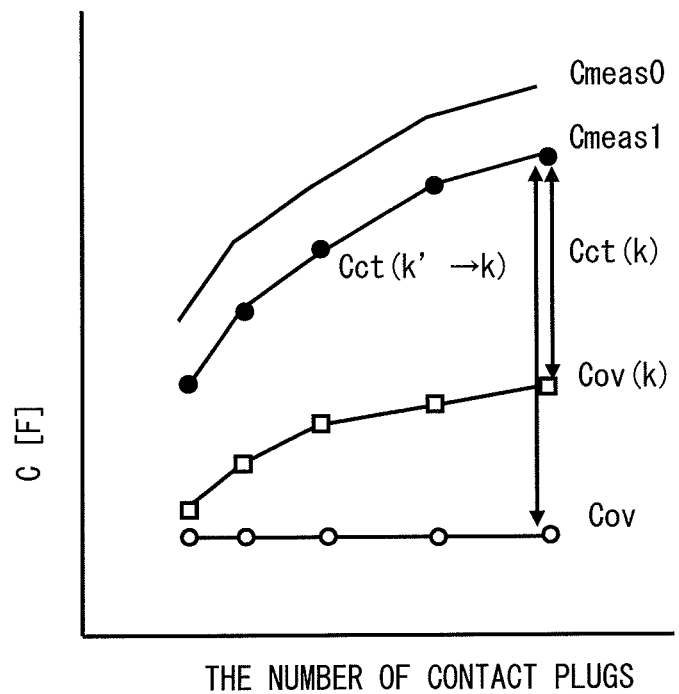
FIG. 5 is a graph showing a capacitance variation according to the number of the contact plugs according to a first exemplary embodiment.

FIG. 5 is a graph showing a capacitance variation according to the number of the contact plugs 16. In FIG. 5, the measured capacitance value Cmeas0 is represented by filled circles. As shown in FIG. 5, the measured capacitance value Cmeas0 increases according to the increase in the number of the contact plugs 16.

Figure 3D:
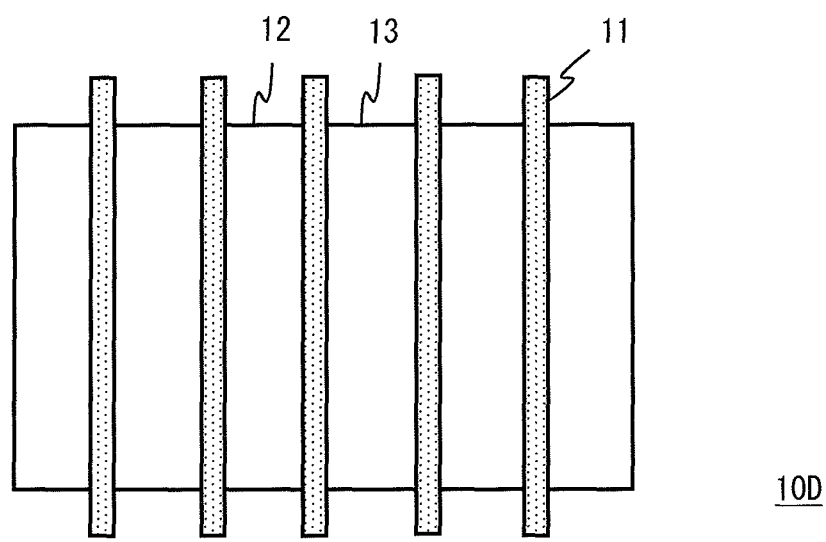
FIG. 3D is a top view showing a configuration of a TEG pattern used in a first exemplary embodiment.

Next, calibration using the TEG pattern 10D shown in FIG. 3D is performed (S3). In the practical measurement, the parasitic capacitance is also generated between other wires, metal layers and via holes arranged between a tester and the MOS transistor to be measured as well as between the gate 15 and contact plug 16. A parasitic capacitance except for the contact parasitic capacitance Cct is defined as a parasitic capacitance Cwire.

In the present exemplary embodiment, as shown in FIG. 3D, the parasitic capacitance Cwire is measured by using the TEG pattern 10D which includes no contact plug 16 on the source 12 and the drain 13. Then a value Cmeas1 is evaluated by subtracting the parasitic capacitance Cwire from the measured capacitance value Cmeas0. The value Cmeas1 is expressed by the following equation (1).

$$Cmeas1 = Cmeas0 - Cwire \quad (1)$$

As a result, the value Cmeas1 includes only the true gate-overlap capacitance Cov to be evaluated and the contact parasitic capacitance Cct. Note that the calibration can be omitted when the parasitic capacitance Cwire is small.

After the calibration, a design gate-overlap capacitance Cov (k) (k is a predetermined shape-variable (model parameter)) is evaluated (S4). First, in particular, design shapes of the TEG patterns 10A to 10C in which the measurement described above is performed are each input to a simulator such as the TCAD (device simulator or capacitance extracting simulator). Then, a design contact parasitic capacitance Cct (k) is evaluated according to each of the number of the contacts.

The design contact parasitic capacitance Cct (k) corresponding to each of the TEG patterns 10A to 10C, which is obtained by above calculation, is subtracted from the corresponding value Cmeas1. The design gate-overlap capacitance Cov (k), which is obtained by above calculation, is expressed by the following equation (2).

$$Cov(k) = Cmeas1 - Cct(k) \quad (2)$$

Then, it is judged whether the design gate-overlap capacitance Cov (k) is constant or not regardless of the number of the contacts (S5). When the design gate-overlap capacitance Cov (k) is about constant regardless of the number of the contacts (the case of YES in S5), the design gate-overlap capacitance Cov (k) is the true gate-overlap capacitance Cov to be evaluated (S7). This is because the true gate-overlap capacitance Cov is constant when the shape of the overlap part between the gate and the drain or the source of the MOS transistor, even if the number of the contact plugs 16 is changed, as described above.

In this case, it is considered that the shape of the contact plugs 16 or the like in the TEG patterns 10A to 10C is substantially formed as planned shape and the contact parasitic capacitance Cct (k) is accurate.

On the other hand, as represented by open squares in FIG. 5, the case of the design gate-overlap capacitance Cov (k) changing according to the number of contacts (the case of NO in S5) is considered. In this case, it is considered that the shape of the contact plugs 16 or the like in the TEG patterns 10A to 10C is not formed as planned shape and the contact parasitic capacitance Cct (k) is not accurate.

Thus, as represented by open circles in FIG. 5, the contact parasitic capacitance Cct (k) capable of keeping the design gate-overlap capacitance Cov (k) constant regardless of the number of the contact plugs 16 is evaluated. In this case, k' which is different from a model parameter k to evaluate the parasitic capacitance between the gate and the contact plug input to the simulator is substituted as the model parameter k. Then, the contact parasitic capacitance Cct (k) corresponding to each of the TEG patterns is recalculated (S6).

For example, a width, a taper angle or a difference of the dielectric constant between the contact plug 16 and the gate 15 may be used as a model parameter to evaluate the parasitic capacitance between the gate 15 and the contact plug 16.

Figure 4A:
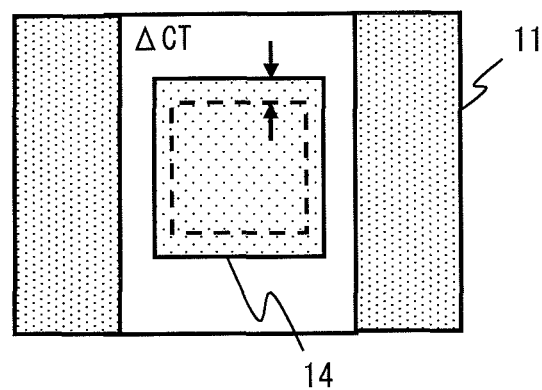
FIG. 4A is a top view showing shape variation of a contact plug according to a first exemplary embodiment.
Figure 4B:
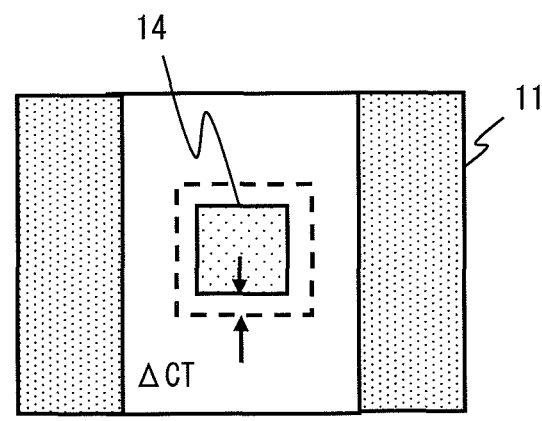
FIG. 4B is a top view showing shape variation of a contact plug according to a first exemplary embodiment.

In the present exemplary embodiment, an example of changing the width of the contact plug 16 is described as an example of the model parameter to evaluate the parasitic capacitance between the contact plug 16 and the gate 15. FIGS. 4A and 4B are top views showing shape variation of the contact plug 16. In FIGS. 4A and 4B, the design value of the contact plug 16 is represented by dashed line.

In FIG. 4A, the length of a side of the rectangular contact plug 16 is lengthened by ΔCT. Thus, the distance between the contact plug 16 and the gate 15 becomes shorter. In FIG. 4B, the length of a side of the rectangular contact plug 16 is shortened by ΔCT. Thus, the distance between the contact plug 16 and the gate 15 becomes longer. Note that the case of lengthening the length of the side of the rectangular contact plug 16 is represented by +, and the case of shortening the length of the side of the rectangular contact plug 16 is represented by −.

For example, it is assumed that a design shape of the contact plug 16 is a square pillar the side of which is 100 nm on the source 12 and drain 13. When the length of the side of the contact plug 16 is just design value of 100 nm, it is defined that ΔCT=0. A the gate-overlap capacitance calculation value Cov (ΔCT=0) obtained in this case is the design gate-overlap capacitance described above.

The length of the side of the contact plug 16 used for the simulation is set. When ΔCT=−5 nm, the length of the side of the contact plug 16 is set at 90 nm. When ΔCT=−2.5 nm, the length of the side of the contact plug 16 is set at 95 nm. When ΔCT=+2.5 nm, the length of the side of the contact plug 16 is set at 105 nm. When ΔCT=+5 nm, the length of the side of the contact plug 16 is set at 110 nm. When ΔCT=+7.5 nm, the length of the side of the contact plug 16 is set at 115 nm.

The simulation is performed in each condition described above. As a result, a contact parasitic capacitance calculation value Cct (ΔCT) corresponding to each of a plurality of the TEG patterns the numbers of the contact plugs 16 of which are different from each other is evaluated.

Then, after returning to S4, the obtained contact parasitic capacitance calculation value Cct (ΔCT) is subtracted from the value Cmeas1, thereby the gate-overlap capacitance calculation value Cov (ΔCT=0) being evaluated (Cov (ΔCT) =Cmeas1−Cct (ΔCT)).

Then, it is judged whether the gate-overlap capacitance calculation value Cov (ΔCT=0) is constant regardless of the number of the contact plugs 16 (S5). When the gate-overlap capacitance calculation value Cov (ΔCT=0) is constant regardless of the number of the contact plugs 16 (the case of YES in S5), the gate-overlap capacitance calculation value Cov (ΔCT=0) is true gate-overlap capacitance Cov to be evaluated (S7).

Figure 6:
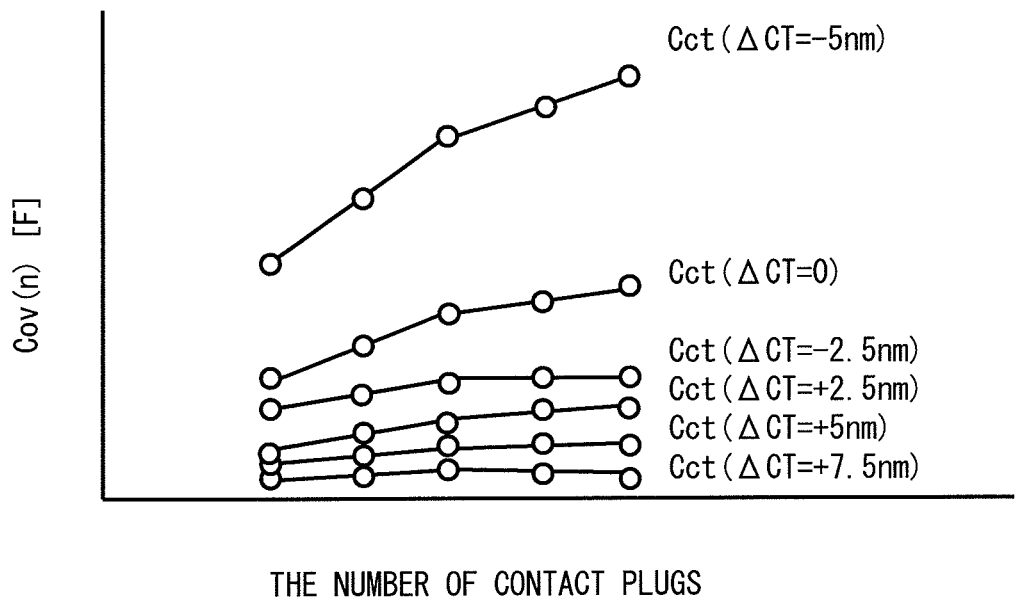
FIG. 6 is a graph showing a variation of a calculation value of a gate-overlap capacitance in accordance with the number of the contact plugs according to a first exemplary embodiment.

FIG. 6 is a graph showing a variation of the gate-overlap capacitance calculation value Cov (ΔCT) according to the number of the contact plugs 16. In FIG. 6, the horizontal axis represents the number of the contact plugs 16, and the vertical axis represents the gate-overlap capacitance calculation value Cov (ΔCT).

As shown in FIG. 6, when the length of the side of the contact plug 16 is 115 nm (ΔCT=+7.5), the gate-overlap capacitance calculation value Cov (ΔCT=+7.5) is about constant regardless of the number of the contact plugs 16.

Therefore, it is confirmed that the contact parasitic capacitance calculation value Cct (ΔCT=+7.5) evaluated in the case of ΔCT=+7.5 is an accurate contact parasitic capacitance. Thus, in the present exemplary embodiment, it is possible to accurately determine the shape of the contact plug 16. As a result, a parasitic capacitance relating to the contact plug 16 can be accurately evaluated. For example, the contact parasitic capacitance Cct which is the parasitic capacitance between the gate 15 and the contact plug 16 can be evaluated.

Further, the gate-overlap capacitance calculation value Cov (ΔCT=+7.5), which is calculated by subtracting the contact parasitic capacitance calculation value Cct (ΔCT=+7.5) from the value Cmeas1, can be judged as the accurate true gate-overlap capacitance to be evaluated.

Thus, such a characteristic is used in the present exemplary embodiment that the value of the true gate-overlap capacitance Cov is not changed when the distance between the contact plug 16 and the gate 15 is not changed even if the number of the contact plugs 16 is changed. Therefore, the contact parasitic capacitance Cct, in which the shape-variation by wafer and the difference between the practically formed shape and the parameter input to the simulator is eliminated, is obtained without cross-sectional observation of the TEG pattern used for the practical measurement. Further, the accurate true gate-overlap capacitance can be extracted by using the accurate contact parasitic capacitance Cct obtained as described above.

[Second Exemplary Embodiment]

Figure 7A:
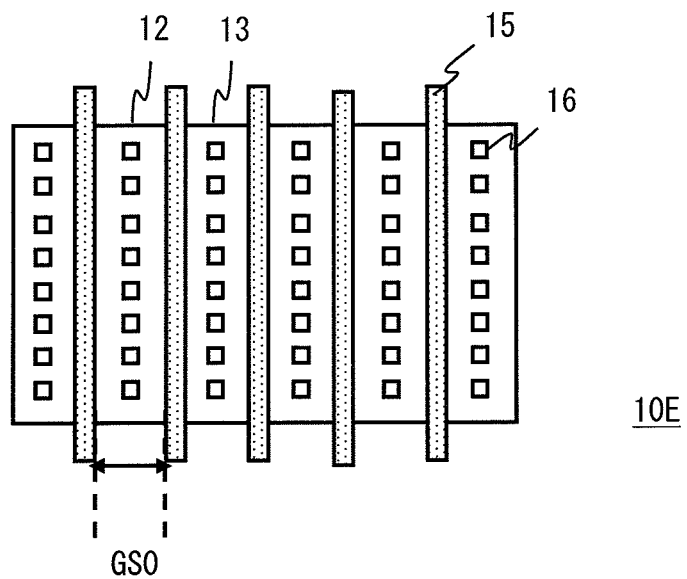
FIG. 7A is a top view showing a configuration of a TEG pattern used in an extracting method according to a second exemplary embodiment.
Figure 7B:
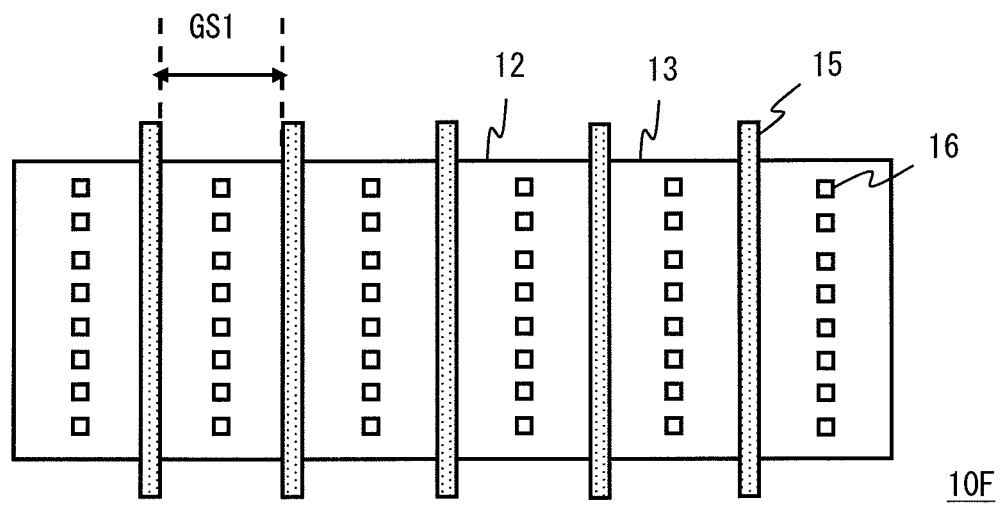
FIG. 7B is a top view showing a configuration of a TEG pattern used in an extracting method according to a second exemplary embodiment.
Figure 8:
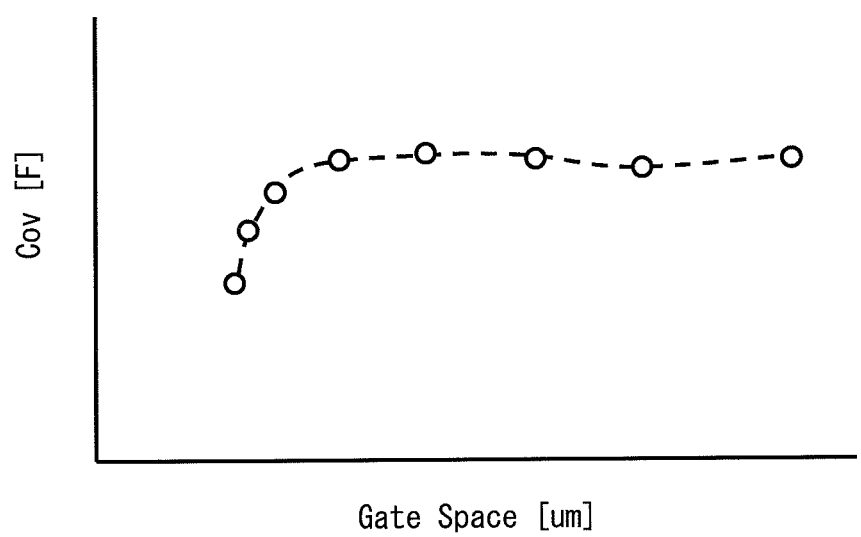
FIG. 8 is a graph showing a variation of a true gate-overlap capacitance in accordance with a gate space variation according to a second exemplary embodiment.

A simulation parameter extracting method of a MOS transistor according to a second exemplary embodiment of the present invention is described with reference to FIGS. 7A, 7B and 8. FIGS. 7A and 7B are top views showing configurations of TEG patterns used in the extracting method according to the present exemplary embodiment. In this case, an example of including the five gates 15 is described. The gates 15 are arranged in parallel each other at a predetermined inter-gate distance.

In the exemplary embodiment, a plurality of TEG patterns in which distances between the neighboring gates 15 are different from each other are prepared. In this case, a TEG pattern 10E the gate space of which is GS0 shown in FIG. 7A and a TEG pattern 10F the gate space of which is GS1 shown in FIG. 7B are used. As shown in FIGS. 7A and 7B, the gate space GS1 is larger than the gate space GS0. In other words, the distance between the gate 15 and the contact plug 16 in the TEG pattern 10F is larger than the distance between the gate 15 and the contact plug 16 in the TEG pattern 10E.

In the TEG patterns 10E and 10F, eight contact plugs 16 are formed on each of the source 12 and the drain 13. Further, TEG patterns, which include six contact plugs 16 and the gate spaces of which are GS0 and GS1, are prepared. Furthermore, TEG patterns, which include four contact plugs 16 and the gate spaces of which are GS0 and GS1, are prepared. In sum, a plurality of the TEG patterns of the gate space GS0 which includes the different numbers of the contact plugs 16 and a plurality of the TEG patterns of the gate space GS1 which includes the different numbers of the contact plugs 16 are used.

First, a true gate-overlap capacitance Cov is extracted by the method described in the first exemplary embodiment by using a plurality of the TEG patterns of the gate space GS0 which includes the different numbers of the contact plugs 16. Next, the true gate-overlap capacitance Cov is extracted by the method described in the first exemplary embodiment by using a plurality of the TEG patterns of the gate space GS1 which includes the different numbers of the contact plugs 16.

Thus, the accurate true gate-overlap capacitances Cov in the case of different gate spaces are evaluated. FIG. 8 is a graph showing a variation of the true gate-overlap capacitance Cov according to the gate space variation. In this way, a gate space dependence of the true gate-overlap capacitance Cov, or a dependence on the distance between the gate 15 and the contact plug 16, is evaluated.

As described in the first exemplary embodiment, the effect of the contact parasitic capacitance Cct, which stands out in the case of the narrow distance between the gate 15 and the contact plug 16, can be accurately eliminated. Therefore, in the present exemplary embodiment, it is possible to evaluate whether the gate space dependence of the true gate-overlap capacitance Cov exists or not. Further, it is possible to accurately evaluate the gate space dependence of the true gate-overlap capacitance Cov.

The present invention is not limited to the exemplary embodiments described above, but may be changed as appropriate without departing from the spirit of the present invention. The present invention may be achieved as a hardware configuration. Further, the present invention may be also achieved by running a computer program of an arbitrary processing in a CPU (Central Processing Unit).

In this case, the computer program can be supplied by being stored to a recording medium. Further, the computer program can be supplied by being transmitted through the communication medium such as the Internet or the like.

Note that the recording medium includes a flexible disc, a hard disc, a magnetic disc, a magnetic optical disc, a CD-ROM, a DVD, a ROM cartridge, a battery backup RAM cartridge, a flash memory cartridge, a nonvolatile RAM cartridge, or the like. Further, the communication medium includes a cable communication such as a telephone line and a wireless communication such as a microwave communication.

Furthermore, the program can be stored and provided to a computer using any type of non-transitory computer readable media. Non-transitory computer readable media include any type of tangible storage media. Examples of non-transitory computer readable media include magnetic storage media (such as floppy disks, magnetic tapes, hard disk drives, etc.), optical magnetic storage media (e.g. magneto-optical disks), CD-ROM (compact disc read only memory), CD-R (compact disc recordable), CD-R/W (compact disc rewritable), and semiconductor memories (such as mask ROM, PROM (programmable ROM), EPROM (erasable PROM), flash ROM, RAM (random access memory), etc.). The program may be provided to a computer using any type of transitory computer readable media. Examples of transitory computer readable media include electric signals, optical signals, and electromagnetic waves. Transitory computer readable media can provide the program to a computer via a wired communication line (e.g. electric wires, and optical fibers) or a wireless communication line.

The first and second exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A simulation parameter extracting method of a MOS transistor that extracts a true gate-overlap capacitance serving as a capacitance of a part in which the gate overlaps the source or the drain, the gate-overlap capacitance being one of parameters used for a simulation of the MOS transistor, the method comprising:
    evaluating a measured value that includes the gate-overlap capacitance by measuring a capacitance between the gate and the drain in each of a plurality of layout patterns at a predetermined bias voltage, the layout patterns including contact plugs that are arranged on and electrically connected to the source and the drain, the number of the contact plugs being different for each layout pattern, other configurations of the layout patterns than the number of the contact plugs being the same for each layout pattern;
    evaluating, by using a computer processor, a gate-overlap capacitance calculation value of each of the plurality of the layout patterns by subtracting a contact parasitic capacitance between the contact plug and the gate from the measured value, the contact parasitic capacitance being obtained by a simulation with varying a model parameter for evaluating a parasitic capacitance between the contact plug and the gate; and
    extracting the gate-overlap capacitance calculation value as the gate-overlap capacitance at the model parameter when the gate-overlap capacitance calculation value is about constant regardless of the number of the contact plugs.

2. The simulation parameter extracting method of a MOS transistor according to claim 1, wherein the model parameter for evaluating the parasitic capacitance between the contact plug and the gate is at least one of a size of the contact plug, a taper angle of the contact plug, and a dielectric constant between the contact plug and the gate.

3. The simulation parameter extracting method of a MOS transistor according to claim 1 comprising:
    arranging in the layout pattern a plurality of the gates in parallel at a predetermined inter-gate interval;
    preparing a plurality of first layout patterns which have the inter-gate interval of a first inter-gate interval and different numbers of the contact plugs;
    preparing a plurality of second layout patterns which have the inter-gate interval of a second inter-gate interval, which is different from the first inter-gate interval, and different numbers of the contact plugs; and
    extracting the true gate-overlap capacitance at each of the inter-gate intervals of the first layout patterns and the second layout patterns.

4. The simulation parameter extracting method of a MOS transistor according to claim 1, wherein the predetermined bias voltage is a value to turn off a channel.

5. The simulation parameter extracting method of a MOS transistor according to claim 4 comprising:
    measuring a capacitance between the gate and the drain at a plurality of bias voltages; and
    deciding the predetermined bias voltage to turn off the channel.

6. A simulation parameter extracting method of a MOS transistor that evaluates a contact parasitic capacitance between a contact plug arranged on and electrically connected to the source or the drain and the gate, the contact parasitic capacitance being one of parameters used for a simulation of the MOS transistor, the method comprising:
    evaluating, by using a computer processor, a measured value that includes a gate-overlap capacitance, serving as a capacitance of a part in which the gate overlaps the source or the drain, by measuring a capacitance between the gate and the drain in each of a plurality of layout patterns at a predetermined bias voltage, the layout patterns including contact plugs, the number of the contact plugs being different for each layout pattern, other configurations of the layout patterns than the number of the contact plugs being the same for each layout pattern;
    evaluating a gate-overlap capacitance calculation value of each of the plurality of the layout patterns by subtracting the contact parasitic capacitance between the contact plug and the gate from the measured value, the contact parasitic capacitance being obtained by a simulation with varying a shape parameter of the contact plug; and
    extracting the contact parasitic capacitance when the simulation is performed in the case of the gate-overlap capacitance calculation value being about constant regardless of the number of the contact plugs.

* * * * *